(12) United States Patent
Ellens et al.

(10) Patent No.: US 6,670,748 B2
(45) Date of Patent: Dec. 30, 2003

(54) ILLUMINATION UNIT HAVING AT LEAST ONE LED AS LIGHT SOURCE

(75) Inventors: Andries Ellens, Den Haag (NL); Torsten Fries, Stadtbergen (DE); Tim Fiedler, Rheine (DE); Günter Huber, Schrobenhausen (DE)

(73) Assignee: Patent-Treuhand-Gesellschaft für Elektrische Glühlampen mbH, Munich (DE)

( * ) Notice: Subject to any disclaimer, the term of this patent is extended or adjusted under 35 U.S.C. 154(b) by 0 days.

(21) Appl. No.: 10/205,922

(22) Filed: Jul. 26, 2002

(65) Prior Publication Data

US 2003/0094893 A1 May 22, 2003

(30) Foreign Application Priority Data

Sep. 25, 2001 (DE) .......................... 101 47 040

(51) Int. Cl.⁷ .............................. H05B 33/14
(52) U.S. Cl. .................. 313/503; 313/502; 313/483; 313/485; 313/512; 252/301.4 F
(58) Field of Search ................ 252/301.4 F; 313/503, 313/502, 483, 485, 512; 257/88, 98

(56) References Cited

U.S. PATENT DOCUMENTS 5,813,752 A   9/1998   Singer et al.
5,998,925 A   12/1999  Shimizu et al.
2002/0032118 A1 * 3/2002 Oshio ................ 501/120
2003/0030038 A1 * 2/2003 Mitomo et al. ...... 252/500
2003/0052595 A1 * 3/2003 Ellens et al. ........ 313/501

FOREIGN PATENT DOCUMENTS

DE   101 33 352.8        7/2001
EP   862 794             9/1996
WO   WO 98/12757         3/1998
WO   WO 01/08453         7/1999
WO   WO 01/39574 A1      6/2001

OTHER PUBLICATIONS

Krevel, "On new rare–earth doped M–Si–Al–O–N materials luminescence properties and oxidation resistance", TU Eindhoven (2000), ISBN 90–386–2711–4, Kapitel 1, pp. 144–157.

* cited by examiner

Primary Examiner—Ashok Patel
Assistant Examiner—Holly Harper
(74) Attorney, Agent, or Firm—Frishauf, Holtz, Goodman & Chick, P.C.

(57) ABSTRACT

An illumination unit having at least one LED as light source, the LED emitting primary radiation in the range from 300 to 570 nm, this radiation being partially or completely converted into longer-wave radiation by phosphors which are exposed to the primary radiation of the LED, in which unit the conversion takes place at least with the aid of a nitride-containing phosphor which emits with a peak emission wavelength at 430 to 670 nm and which originates from the class of the Ce- or Eu-activated nitrides, oxynitrides or sialons.

37 Claims, 4 Drawing Sheets

ILLUMINATION UNIT HAVING AT LEAST ONE LED AS LIGHT SOURCE

TECHNICAL FIELD

The invention is based on an illumination unit having at least one LED as light source in accordance with the preamble of claim 1. This is in particular an LED which emits in the visible or white region and is based on an LED which emits primarily UV/blue.

BACKGROUND ART

An illumination unit which emits, for example, white light is currently obtained predominantly by combining a Ga(In)N-LED, which emits in the blue at approximately 460 nm, and a yellow-emitting YAG:Ce$^{3+}$ phosphor (U.S. Pat. No. 5,998,925 and WO 98/12757). For good color rendering, two different yellow phosphors are often used, as described in WO-A 01/08453. A problem in this case is that the two phosphors often have different temperature characteristics, even if their structures are similar. A known example is the yellow-luminescent Ce-doped Y garnet (YAG:Ce) and the (Y,Gd) garnet which, by comparison, is luminescent at a longer wavelength. This leads to fluctuations in the color locus and changes in the color rendering at different operating temperatures.

The publication "On new rare-earth doped M—Si—Al—O—N materials" by van Krevel, TU Eindhoven 2000, ISBN 90-386-2711-4, Chapter 11 has disclosed a number of classes of phosphor materials which have the structure of nitrides or oxynitrides or are known as sialons (in particular α-sialons), which represent a contraction of their composition. An emission in a wide optical spectral region with excitation at 365 nm or 254 nm is achieved by means of doping with Eu, Tb or Ce.

DISCLOSURE OF THE INVENTION

It is an object of the present invention to provide an illumination unit having at least one LED as light source, the LED emitting primary radiation in the range from 300 to 570 nm, this radiation being partially or completely converted into the longer-wave radiation by phosphors which are exposed to the primary radiation of the LED and the structure of which is based on nitrides or derivatives thereof, which is distinguished by a high level of constancy at fluctuating operating temperatures. A further object is to provide an illumination unit which emits white light and in particular has a good color rendering and a high output. A further object is to provide a new daylight fluorescent pigment.

This object is achieved by the following features: the conversion takes place with the aid of at least one phosphor which is derived from a cation M and a silicon nitride or a derivative of a nitride which emits with a peak emission wavelength at 430 to 670 nm, the cation being partially replaced by a dopant D, namely Eu$^{2+}$ or Ce$^{3+}$, at least one of the divalent metals Ba, Ca, Sr and/or at least one of the trivalent metals Lu, La, Gd, Y being used as cation M, the phosphor originating from one of the following classes which provide as such new daylight fluorescent pigments:

nitrides of the structure $MSi_3N_5$, $M_2Si_4N_7$, $M_4Si_6N_{11}$ and $M_9Si_{11}N_{23}$, oxynitrides of the structure $M_{16}Si_{15}O_6N_{32}$ sialons of the structure $MSiAl_2O_3N_2$, $M_{13}Si_{18}Al_{12}O_{18}N_{36}$, $MSi_5Al_2ON_9$ and $M_3Si_5AlON_{10}$.

Particularly advantageous configurations are given in the dependent claims.

According to the invention, the phosphor used for the LEDs is a phosphor from one of a number of nitride-based phosphor classes.

These are certain classes of nitrides and their derivatives oxynitrides and sialons. The phosphor which is derived from a cation M and a silicon nitride or a derivative of a nitride emits with a peak emission wavelength of 430 to 670 nm, the cation being partially replaced by a dopant D, namely Eu$^{2+}$ or Ce$^{3+}$, the cation M used being at least one of the divalent metals Ba, Ca, Sr and/or at least one of the trivalent metals Lu, La, Gd, Y, the phosphor originating from one of the following classes:

nitrides of the structure $MSi_3N_5$, $M_2Si_4N_7$, $M_4Si_6N_{11}$, and $M_9Si_{11}N_{23}$, oxynitrides of the structure $M_{16}Si_{15}O_6N_{32}$;

sialons of the structure $MSiAl_2O_3N_2$, $M_{13}Si_{18}Al_{12}O_{18}N_{36}$, $MSi_5Al_2ON_9$ and $M_3Si_5AlON_{10}$.

The following specific phosphors are particularly preferred:

$$M'M''Si_4N_7:D \qquad\qquad 1.$$

where

M'=Sr or Ba, in each case alone or in combination, and in particular M' is partially (up to 20 mol %) replaced by Ca; M' is a divalent ion.

M''=Lu alone or in combination with Gd and/or La; M'' is a trivalent ion.

A specific example is $SrLuSi_4N_7:Eu^{2+}$.

$$M'M''Si_6N_{11}:D \qquad\qquad 2.$$

where $M'=Ba_xSr_{3-x}$, preferably x=1.5; M' is divalent;

where M''=Lu alone or in combination with Gd and/or La and/or Y; M'' is trivalent;

To a certain extent, the quantities of Ba$^{2+}$ and Sr$^{2+}$ may vary (the value for x may fluctuate between 1.3 and 1.7), and these components may be partially (up to 20 mol % of the total quantity of M') replaced by Ca$^{2+}$.

A specific example is $BaLuSi_6N_{11}:Eu$.

$$M''_3Si_6N_{11}:D \qquad\qquad 3.$$

Where M''=La alone or in combination with Gd and/or Y and/or Lu; M'' is a trivalent ion.

Preferably, D=Ce$^{3+}$.

A specific example is $La_3Si_6N_{11}:Ce$.

$$M'_2M''_7Si_{11}N_{23}:D \qquad\qquad 4.$$

Where M'=Ba alone or in combination with Sr (up to 50 mol %)

M''=La alone or in combination with Gd and/or Lu;

A specific example is $Ba_2La_7Si_{11}N_{23}:Eu$ $$M''Si_3N_5:D \qquad\qquad 5.$$

Where M''=La alone or in combination with Gd and/or Lu;

Where D=Ce.

A specific example is $LaSi_3N_5:Ce$.

Furthermore, they may be certain classes of oxynitrides, namely those of type $M''_{16}Si_{15}O_6N_{32}:D$. As trivalent cation M'', these oxynitrides use at least one of the metals La, Gd, Lu or Y. The cation is partially replaced by a dopant D, namely $Eu^{2+}$ or $Ce^{3+}$. The following specific phosphors are particularly preferred:

$$M''_{16}Si_{15}O_6N_{32}:Ce \qquad 6.$$

where M''=La alone or in combination with Gd and/or Lu;
a specific example is $La_{16}Si_{15}O_6N_{32}:Ce$.

Furthermore, they are certain classes of sialons, i.e. those of type MSiAlON:D. As divalent or trivalent cation M'', these sialons use at least one of the metals Ba, Sr, Ca, La, Gd, Lu or Y. The cation is partially replaced by a dopant D, namely $Eu^{2+}$ or $Ce^{3+}$. The following specific phosphors are particularly preferred:

$$M'SiAl_2O_3N_2:D \qquad 7.$$

where M'=Sr alone or in combination with Ba and/or $Ca^{2+}$; the proportion of Ba may be up to 50 mol %, and the proportion of Ca may be up to 20 mol %.
A specific example is $SrSiAl_2O_3N_2:Eu$.

$$M'_3M''_{10}Si_{18}Al_{12}O_{18}N_{36}:D \qquad 8.$$

where M'=Sr alone or in combination with Ba and/or Ca; the proportion of Ba may be up to 50 mol %, and the proportion of Ca may be up to 20 mol %;
where M''=La alone or in combination with Gd and/or Lu; preferably, $M'=Sr^{2+}$ and/or $M''=La^{3+}$;
a specific example is $Sr_3La_{10}Si_{18}Al_{12}O_{18}N_{36}:Eu$.

$$M''Si_5Al_2ON_9:Ce^{3+} \qquad 9.$$

where M''=La alone or in combination with Gd and/or Lu;
A specific example is $LaAl_2Si_5ON_9:Ce$.

$$M''_3Si_5AlON_{10}:Ce^{3+} \qquad 10.$$

where M''=La alone or in combination with Gd and/or Lu;
Preferably, $M''=La^{3+}$.
A specific example is $La_3Si_5AlON_{10}:Ce$.

The proportion of the dopant (i.e. the Eu or Ce content) which replaces some of the cation M should be 0.5 to 15%, preferably 1 to 10%, of the M cation, so that the emission wavelength can be selected accurately and the light efficiency can be optimized. An increasing dopant content generally shifts the peak emission toward longer wavelengths. Surprisingly, it has been found that a changing concentration of the cation M also shifts the peak emission wavelength. At a low concentration of the M cation, good absorption by the dopant can be obtained by selecting the amount of this dopant to be 5 to 10 mol % of the M cation.

These novel optically active materials can be summarized as pigments with daylight fluorescence, in particular also as phosphors. What this means is that the material can be used either as a pigment or as a light-converting system for applications such as displays, lamps or LEDs, or may even be suitable for both purposes.

A further promising representative of this class of the Eu-activated sialons is an α-sialon which corresponds to the formula $M_{p/2}Si_{12-p-q}Al_{p+q}O_qN_{16-q}:Eu^{2+}$ where M=Ca individually or in combination with at least one of the metals Sr or Mg, where q=0 to 2.5 and p=0.5 to 3, referred to below as a YO sialon.

These novel optically active materials are preferably doped with (or contain) $M^{2+}=Eu^{2+}$ or $M^{3+}=Ce^{3+}$. Moreover, in the case of Ce-doping, there may also be a small amount of co-doping (up to 30 mol % of the Ce) with $Pr^{3+}$ or $Tb^{3+}$. In the case of doping with Eu, co-doping (up to four times the amount of Eu) with $Mn^{2+}$ is possible. With these combinations, it is possible for energy to be transferred from the first doping to the co-doping.

With regard to the application as a means for converting radiation sources with primary radiation between 300 and 570 nm, optically active materials doped with Eu are particularly preferred.

The novel optically active materials are all very robust and are also thermally and chemically stable, since their basic structure is based on tetrahedra, either of the Si—(O, N) or Al—(O,N) type. In this context, the term Si—(O,N) or Al—(O,N) tetrahedron means: firstly one of the groups $SiN_4$, $SiON_3$, $SiO_2N_2$ or $SiO_3N$, and secondly one of the groups $AlN_4$, $AlON_3$, $AlO_2N_2$ or $AlO_3N$. The materials whose basic structure includes Si and/or Al tetrahedra with at least two or more nitride ($N_3$) ligands are preferred. Generally, it has been established that the absorption of optically active ions D (irrespective of whether they are divalent or trivalent) which have a broadband absorption shifts toward longer wavelengths as the proportion of N in the tetrahedra rises.

The absorption of divalent activators $D^{2+}$, preferably $Eu^{2+}$ on its own, may in principle be shifted from the UV into the orange-red (up to approximately 590 nm), depending on the amount of nitride in the tetrahedra. The absorption of trivalent activators $D^{3+}$, preferably $Ce^{3+}$ on its own, can in principle be shifted from the UV into the blue-green (up to approximately 495 nm), depending on the amount of nitride in the tetrahedra. Further factors which influence the position of the absorption maximum are the coordination and the specific lattice point at which the activator ion is located.

The preferred lattice positions for $D^{2+}$ are $M'=Sr^{2+}$ and $Ca^{2+}$, but $Ba^{2+}$ is also suitable. Coordination numbers from 6 to 9 are preferred with regard to these divalent cations. The lower the coordination number, the longer the absorption wavelength. The coordination number is dependent on the volume considered, i.e. the greater the volume selected, the higher the coordination becomes. For example, in $SrSiAl_2O_3N_2$, the ion $Sr^{2+}$ is coordinated by ligands in the form of the anions $N^{3-}$ and $O^{2-}$. Specifically, there are six ligands with a spacing for $Sr^{2+}$ of 2.04–2.95 Å, and furthermore two additional ligands with a spacing of approximately 3.04 Å, and finally also one further ligand with a spacing of 3.18 Å. Therefore, depending on the volume considered, the coordination number is either 6, 8 or 9.

Table 1 below presents the preferred maximum spacings of the coordinated ions, in each case using the mean of the spacings of all the closest ions taken into consideration in connection with the coordination. This applies in the case of exclusively divalent cations M' or at least predominantly (more than 80%) divalent cations M'. By way of example, Table 1 shows the following: an $Eu^{2+}$ ion, for example at a $Ba^{2+}$ location in a lattice, should have seven ligands with a mean spacing of at most 3.015 Å, or should have eight ligands with a mean spacing of at most 3.02 Å. In each case one of these conditions, in particular the condition for the lowest ligand number, should be satisfied in order to achieve the desired good properties of the pigment. The ions $Ba^{2+}$ and $Sr^{2+}$ are so large that in general they always have at least six ligands gathered around them. The smaller ion $Ca^{2+}$ in some cases makes do with five ligands. In the case of mixed compounds of the three cations M', the condition relating to the dominant cation applies.

TABLE 1 mean preferred maximum spacings (in Å) between divalent ion and ligands as a function of the number of ligands

| M' Ion | Number of ligands | | | | |
|---|---|---|---|---|---|
| | 5 | 6 | 7 | 8 | 9 |
| $Ba^{2+}$ | | 2.95 | 3.015 | 3.02 | 3.03 |
| $Sr^{2+}$ | | 2.8 | 2.9 | 3.015 | 3.02 |
| $Ca^{2+}$ | 2.62 | 2.65 | 2.7 | | |

For optical applications, in which $D^{2+}=Eu^{2+}$, and in which the optically active material is intended to convert light with wavelengths of between 300–570 nm partially or completely into visible light, the preferred ions are $Sr^{2+}$ and $Ca^{2+}$. The condition which is preferably to be observed with regard to the coordination is, for $Sr^{2+}$, the condition for six or seven ligands. The condition with regard to the coordination which is preferably to be observed for $Ca^{2+}$ is the condition for five or six ligands.

Compounds which satisfy at least one of the conditions in Table 1 have a high absorption, with a maximum between 300 and 570 nm, and convert efficiently.

They are in particular compounds from class 7 ($M'SiAl_2O_3N_2$:D) and the α-sialons as described in German application 101 33 352.8. Table 2 gives a number of examples.

Table 2: spacings A1 to A7 (in Å) of the first to seventh closest ligand, and mean Mw5 to Mw7 calculated therefrom for the spacings of the first five to seven ligands, based on the Ca or Sr ion, for various compounds.

| Compound | A1 | A2 | A3 | A4 | A5 | A6 | A7 | Mw5 | Mw6 | Mw7 |
|---|---|---|---|---|---|---|---|---|---|---|
| $Ca_{0.68}Si_{10}Al_2N_{15.3}O_{0.7}$:$Eu^{2+}$ | 2.602 | 2.602 | 2.602 | 2.631 | 2.694 | 2.695 | 2.695 | 2.626 | 2.638 | 2.646 |
| $SrSiAl_2O_3N_2$:$Eu^{2+}$ | 2.504 | 2.666 | 2.731 | 2.763 | 2.874 | 2.947 | 3.042 | 2.708 | 2.748 | 2.790 |
| $Ca_{1.5}Al_3Si_9N_{16}$:$Eu^{2+}$ | 2.60 | 2.60 | 2.60 | 2.62 | 2.69 | 2.69 | 2.69 | 2.62 | 2.63 | 2.64 |

Compounds of this type are thermally and chemically stable. For applications in which these optically active materials have to be dispersed (for example in casting resin of an LED), a further advantage of these materials is that they have a good impact strength and are damaged scarcely, if at all, during the milling process carried out in mills. Such damage to the grains as a result of the milling operation reduces the efficiency of other phosphors.

Material design methods make it possible to deliberately create phosphors which are based on Si/Al—N and have a specific emission in a wide range between blue and dark red.

A particular advantage of these nitride-based systems is that it thereby becomes possible for a plurality of Si/Al—N-based phosphors with similar physical characteristics to be used together in order, for example, to produce a white LED. A similar consideration also applies with regard to the primary light source, which is very often also nitride-based, since it generally involves semiconductor components based on InN, GaN and AlN. The Si/Al—N-based phosphors according to the invention can in this case be applied directly with particular success.

Particular advantages of these phosphors in connection with an LED-based illumination unit are a high efficiency, excellent thermal stability (insensitive to changes in the operating temperature) and a surprisingly high luminescence extinction temperature, as well as the associated high color rendering, in particular in combination with at least one further phosphor.

A further advantage of this class of phosphors is that the starting material (in particular $Si_3N_4$) is already present in extremely finely dispersed form. Consequently, it is often not necessary to mill the phosphor. By contrast, conventional phosphors, such as YAG:Ce, which are likewise produced by solid-state synthesis, have to be milled, so that they remain dispersed in the casting resin and do not sink to the bottom. This milling operation often leads to efficiency losses. These phosphors therefore no longer have to be milled, which saves one operation and means that there are no efficiency losses. Typical mean grain sizes of the phosphor powder are 0.5 to 5 μm.

In addition to the production of a colored light source by excitation by means of UV radiation from an LED, in particular the generation of white light with the aid of these phosphors offers advantages. This is achieved with a UV-emitting LED as primary light source by using at least three phosphors, and with a blue-emitting LED as primary light source by using at least two phosphors.

White light with good color rendering is generated in particular by the combination of a UV-LED (e.g. primary emission at 300 to 470 nm) with two to three phosphors, of which at least one is a nitride-containing phosphor according to the invention.

The major advantages of nitride-containing phosphors are their pronounced stability with respect to hot acids, lyes and also their thermal and mechanical stability.

BRIEF DESCRIPTION OF THE DRAWINGS

The invention is explained in more detail below with reference to a plurality of exemplary embodiments. In the drawings.

BEST MODE FOR CARRYING OUT THE INVENTION

Figure 1A:
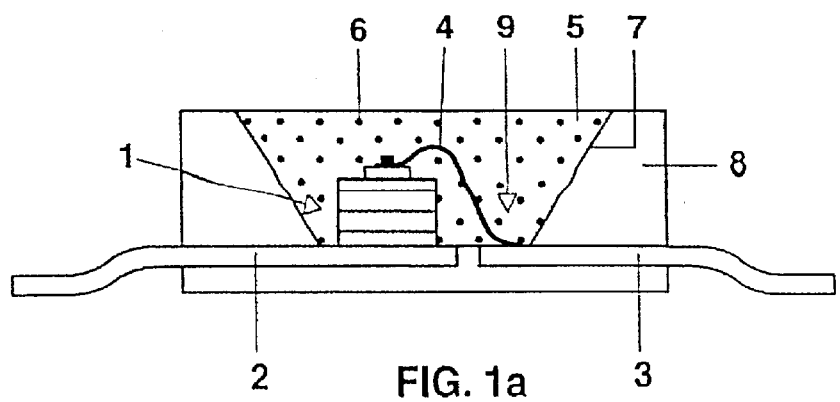
FIGS. 1a and 1b show a semiconductor component which is used as light source (LED) for white light with (FIG. 1a) and without (FIG. 1b) casting resin.

For use in a white LED together with an InGaN chip, by way of example a structure which is similar to that described in U.S. Pat. No. 5,998,925 is used. The structure of a light source of this type is shown specifically for white light in FIG. 1a. The light source is a semiconductor component (chip 1) of type InGaN, with a peak emission wavelength of 400 nm, having a first and a second electrical connection 2, 3, which are embedded in an opaque base housing 8 in the region of a recess 9. One of the connections 3 is connected to the chip 1 via a bonding wire 4. The recess has a wall 17 which serves as reflector for the blue primary radiation of the chip 1. The recess 9 is filled with a potting compound 5 which as its main constituents contains a silicone casting resin (or alternatively epoxy casting resin) (80 to 90% by weight) and phosphor pigments 6 (less than 15% by weight). There are also further small amounts of, inter alia, methyl ether and Aerosil. The phosphor pigments are a mixture of two (or more) nitride-containing pigments which emit red and green.

Figure 1B:
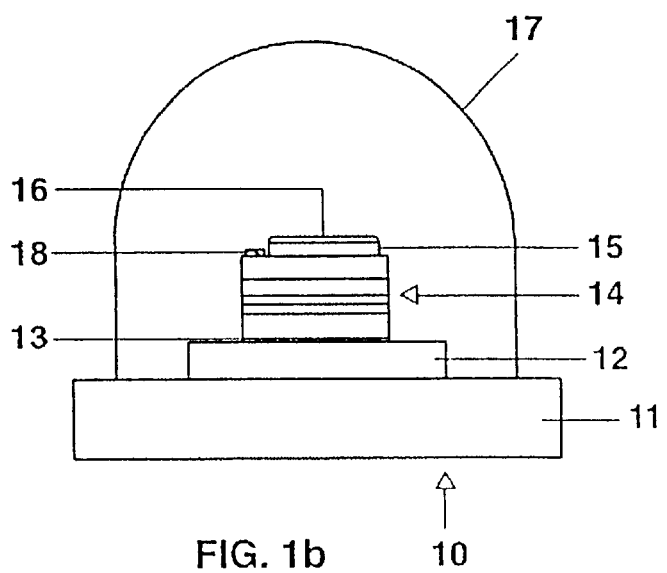

FIG. 1b shows an exemplary embodiment of a semiconductor component 10 in which the conversion into white light is carried out by means of conversion layers 16 which are applied directly to the individual chip, in a similar manner to that described in U.S. Pat. No. 5,813,752. On a substrate 11, there is a contact layer 12, a reflector 13, an LED 14, a filter 15 and a phosphor layer 16, which can be excited by the primary radiation, for converting it into visible long-wave radiation. This structural assembly is surrounded by a plastic lens 17. Of the two ohmic contacts, only the upper contact 18 is illustrated.

Figure 2:
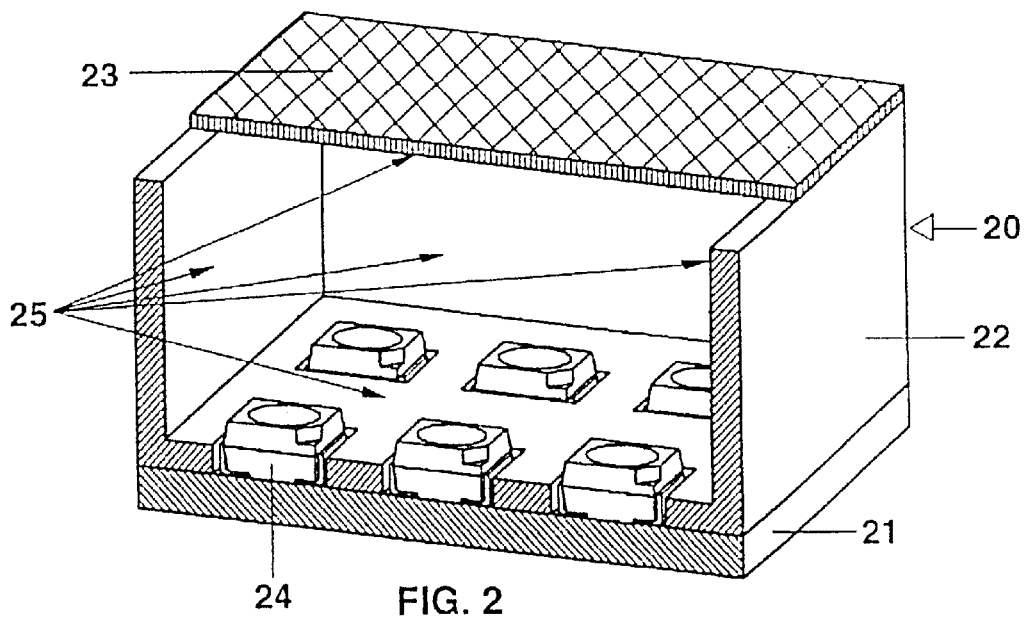
FIG. 2 shows an illumination unit with phosphors in accordance with the present invention.

FIG. 2 shows part of a surface-lighting fitting 20 as illumination unit. It comprises a common support 21, to which a cuboidal outer housing 22 is adhesively bonded. Its upper side is provided with a common cover 23. The cuboidal housing has cutouts in which individual semiconductor components 24 are accommodated. They are UV-emitting light-emitting diodes with a peak emission of 360 nm. The conversion into white light takes place by means of conversion layers 25 which are applied to all surfaces which are accessible to the UV radiation. These include the inner surfaces of the side walls of the housing, of the cover and of the base part. The conversion layers 25 consist of three phosphors which emit in the red, green and blue spectral regions using the phosphors according to the invention.

A number of phosphors in accordance with the invention are compiled in Table 3. These are sialons and nitrides with different coordination numbers.

Table 4 shows the typical luminescence range (in nm) of various nitride-containing phosphors which are listed in detail. These phosphors cover a wide spectrum from blue to red.

FIGS. 3 and 4 show the emission and reflection behavior of various nitride-containing phosphors as a function of the wavelength.

Figure 3A:
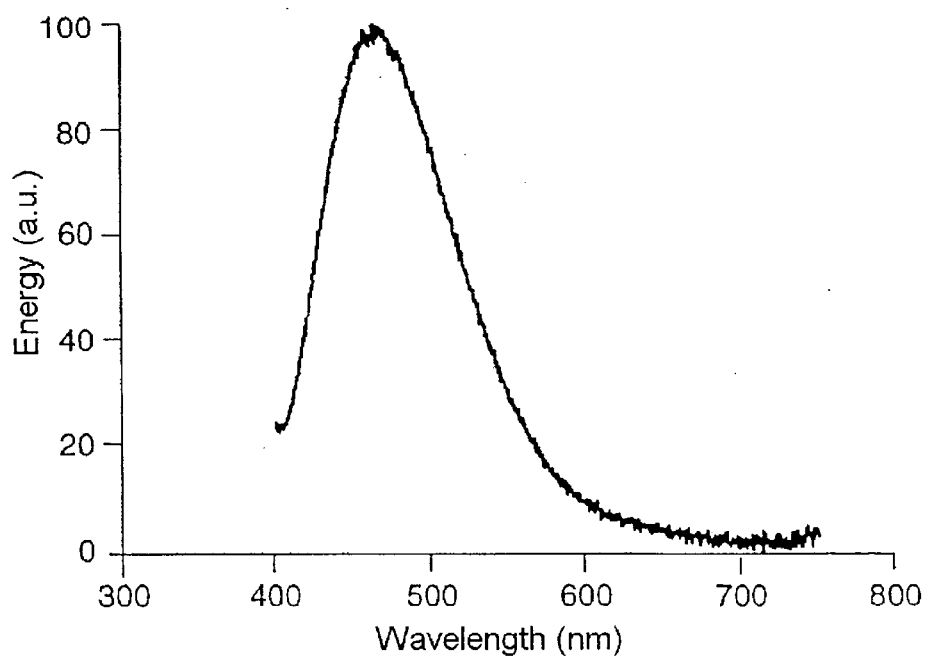
FIGS. 3a, 3b, 4a and 4b show the emission spectrum and the reflection spectrum of various nitride-containing phosphors in accordance with the present invention.
Figure 3B:
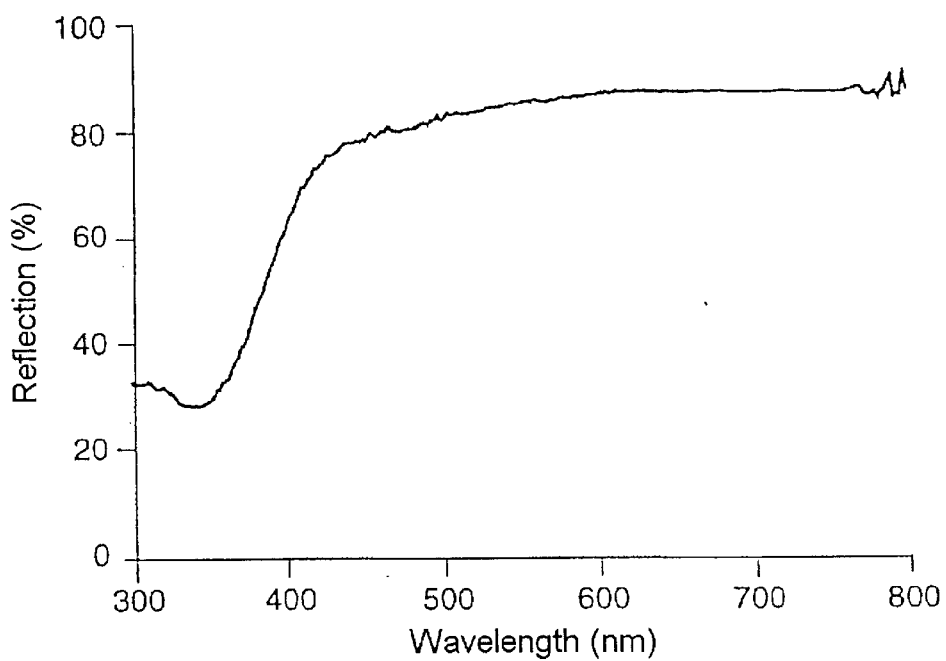

In detail, FIG. 3a shows the emission spectrum of the sialon $SrSiAl_2O_3N_2:Ce^{3+}$ (4%) (i.e. the Ce forms 4 mol % of the cation Sr) (test number TF23A/01) with excitation by 390 nm. The maximum lies in the blue at 466 nm, the mean wavelength at 493 nm. The reflection (FIG. 3b) is approximately R400=60% at 400 nm and approximately R370=37% at 370 nm.

The synthesis of the sialon TF23A/01 is described more accurately below, by way of example.

The phosphor powder is produced by means of a high-temperature solid-state reaction. For this purpose, by way of example, the high-purity starting materials $SrCO_3$, AlN and $Si_3N_4$ are mixed, with a molar ratio of 1:2:1. The grain size of the $Si_3N_4$ is $d_{50}$=1.6 μm, with $d_{10}$=0.4 and $d_{90}$=3.9 μm. For the purpose of doping, a small quantity of $CeO_2$ is added, replacing the corresponding molar amount of $SrCO_3$.

After the individual components have been intimately mixed, the powder is heated at approx. 1400° C. for approximately 15 h in a reducing atmosphere ($N_2/H_2$) and thereby reacts to form the compound described above.

Figure 4A:
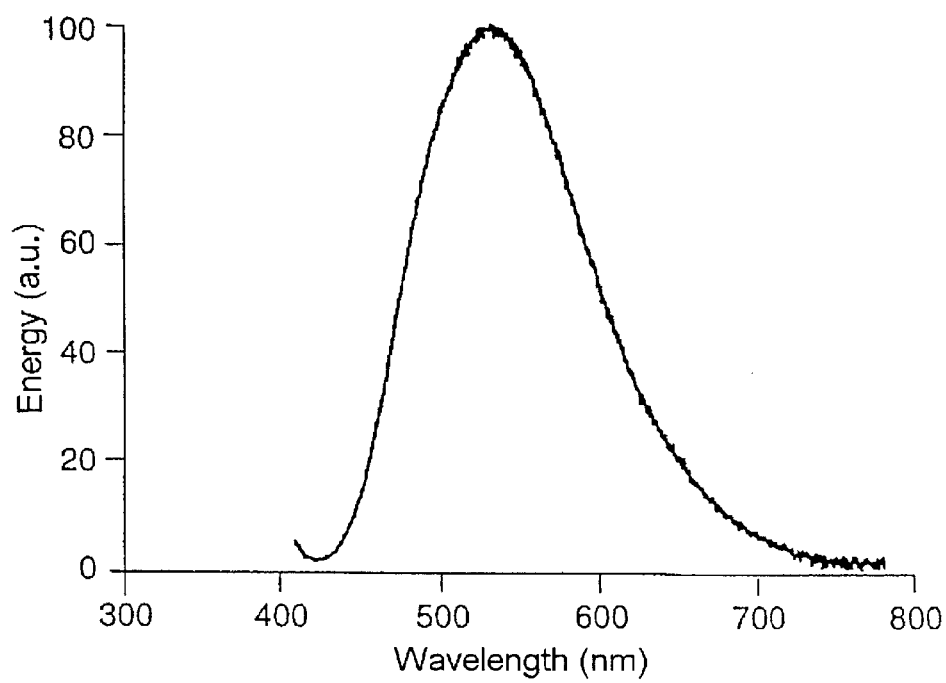
Figure 4B:
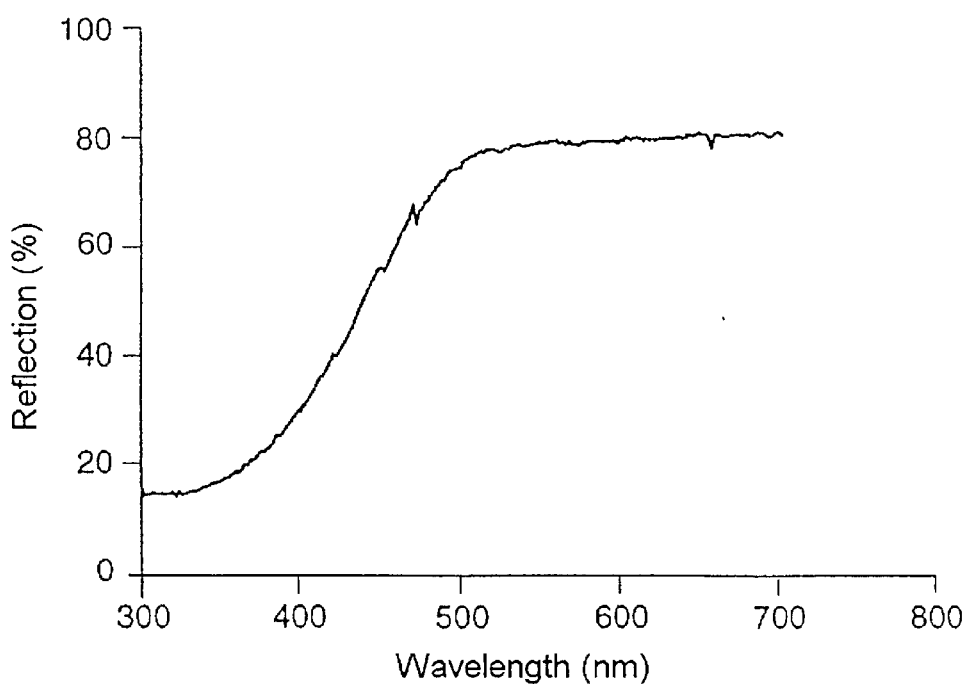

FIG. 4 shows the emission spectrum (FIG. 4a) of the sialon $SrSiAl_2O_3N_2:Eu^{2+}$ (4%) (test number TF31A/01) with excitation by 400 nm. The maximum is in the green at 534 nm, the mean wavelength at 553 nm. The quantum efficiency QE is 43%. The reflection (FIG. 4b) is approximately R400=31% at 400 nm and approximately R370=22% at 370 nm.

Figure 5:
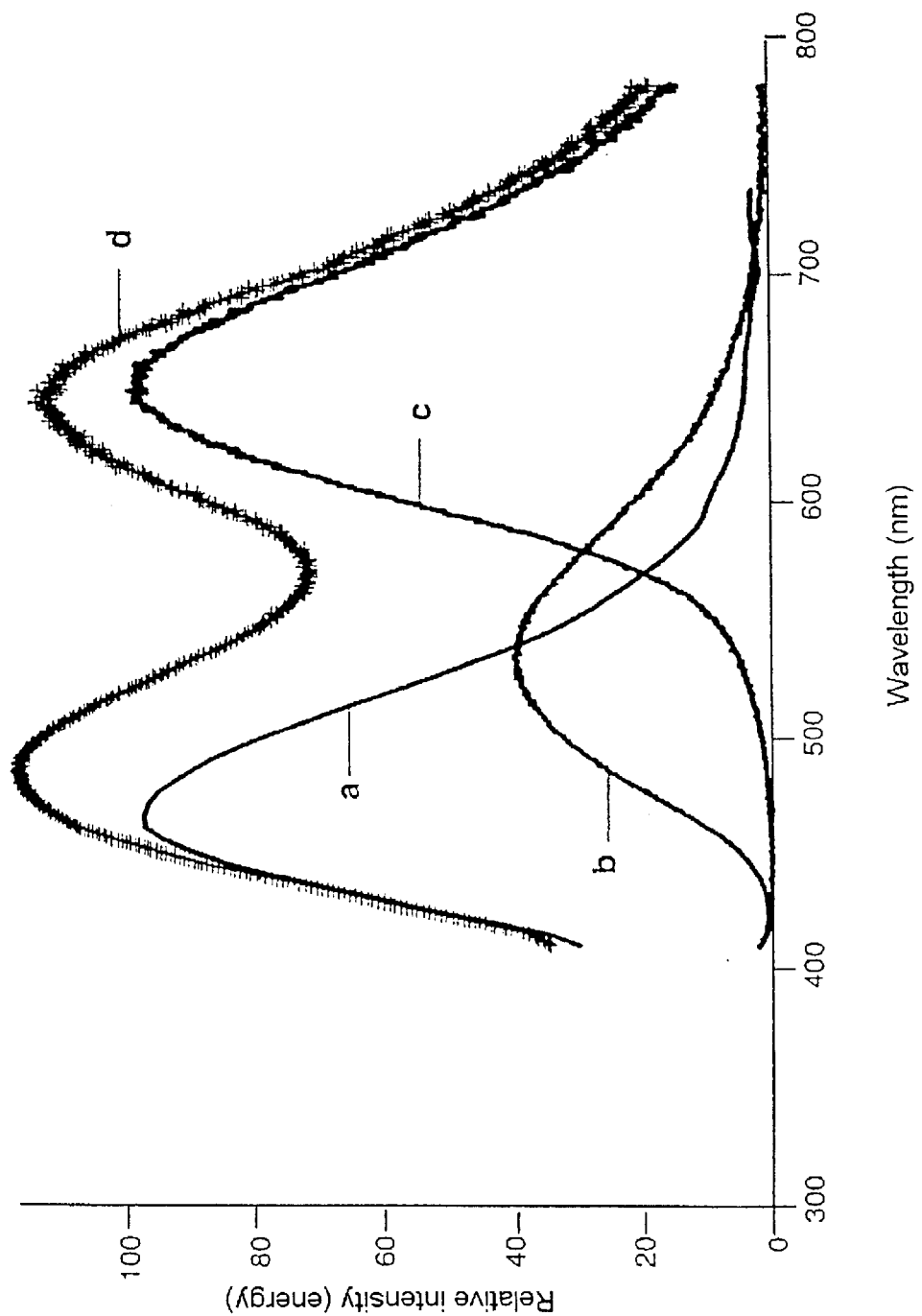
FIG. 5 shows the emission spectrum of an LED with three nitride-containing phosphors in accordance with the present invention.

FIG. 5 shows the emission spectrum for a white LED based on primary excitation by means of an InGaN chip with a peak emission of 360 nm in accordance with the exemplary embodiment shown in FIG. 1a, using the blue- and green-emitting sialons from FIGS. 3 and 4 and the red-emitting α-sialon $Sr_2Si_5N_8:Eu$ which is known per se, cf. WO 01/39574. Suitable mixing results in a color locus of x=0.331, y=0.330 in the immediate vicinity of the white point.

This shows the particular suitability of the nitride-containing phosphors for use in luminescence conversion LEDs and in particular in phosphor mixtures together with other temperature-stable phosphors.

TABLE 3

| Compound | QE | R360 | R400 | Max. Em. | X | y |
|---|---|---|---|---|---|---|
| $SrSiAl_2O_3N_2:Ce^{3+}$ | 29 | 30 | 60 | 466 | 0.182 | 0.232 |
| $SrSiAl_2O_3N_2:Eu^{2+}$ | 51 | 25 | 42 | 497 | 0.304 | 0.432 |
| $La_3Si_6N_{11}:Ce^{3+}$ | 30 | 13 | 39 | 451 | 0.157 | 0.145 |

TABLE 4

| Phosphor | DOP (mol % of the cation) | Luminescence range |
|---|---|---|
| $SrSiAl_2O_3N_2:Eu^{2+}$ | 2 to 10 | 495 to 515 nm |
| $CaSiAl_2O_3N_2:Eu^{2+}$ | 2 to 6 | 550 to 570 nm |
| $SrSiAl_2O_3N_2:Ce^{3+}$ | 2 to 6 | 455 to 480 nm |
| $SrSiAl_2O_3N_2:Eu^{2+}$ | 1 to 5 | 490 to 510 nm |
| $CaSi_6AlON_9:Eu^{2+}$ | 3 to 6 | 570 to 595 nm |
| $La_3Si_6N_{11}:Ce^{3+}$ | 2 to 5 | 435 to 452 nm |
| $Sr_2Si_4AlON_7:Eu^{2+}$ | 2 to 4 | 625 to 640 nm |

What is claimed is:

1. An illumination unit having at least one LED as light source, the LED emitting primary radiation in the range from 300 to 570 nm, this radiation being partially or completely converted into the longer-wave radiation by phosphors which are exposed to the primary radiation of the LED and the structure of which is based on nitrides or derivatives thereof, wherein the conversion takes place with the aid of at least one phosphor which is derived from a cation M and a silicon nitride or a derivative of a nitride which emits with a peak emission wavelength at 430 to 670 nm, the cation being partially replaced by a dopant D, namely $Eu^{2+}$ or $Ce^{3+}$, at least one of the divalent metals Ba, Ca, Sr and/or at least one of the trivalent metals Lu, La, Gd, Y being used as cation M, the phosphor originating from one of the following classes:

nitrides of the structure $MSi_3N_5$, $M_2Si_4N_7$, $M_4Si_6N_{11}$ and $M_9Si_{11}N_{23}$, oxynitrides of the structure $M_{16}Si_{15}O_6N_{32}$ sialons of the structure $MSiAl_2O_3N_2$, $M_{13}Si_{18}Al_{12}O_{18}N_{36}$, $MSi_5Al_2ON_9$ and $M_3Si_5AlON_{10}$.

2. The illumination unit as claimed in claim 1, wherein the proportion of the dopant is 0.5 to 15 mol % of the cation.

3. The illumination unit as claimed in claim 1, wherein, in the case of doping with $Ce^{3+}$, an additional dopant, namely $Pr^{3+}$ and/or $Tb^{3+}$, is used, the content of which forms at most 30 mol % of the $Ce^{3+}$ content.

4. The illumination unit as claimed in claim 1, wherein, in the case of doping with $Eu^{2+}$, an additional dopant, namely $Mn^{2+}$, is used, the proportion of which additional dopant amounts to at most four times the proportion of $Eu^{2+}$.

5. The illumination unit as claimed in claim 1, wherein each $Eu^{2+}$ ion in the phosphor is coordinated by at least two or more nitride ligands.

6. The illumination unit as claimed in claim 1, wherein a plurality of nitride-containing phosphors are used together, and in particular exclusively, in order to produce in particular a white-emitting illumination unit.

7. The illumination unit as claimed in claim 1, wherein the phosphors according to the invention are dispersed in silicone resin or are applied directly to the LED.

8. The illumination unit as claimed in claim 1, wherein the LED is a nitride-based semiconductor component.

9. The illumination unit as claimed in claim 6, wherein, to generate white light, the primary radiation emitted is in the wavelength region from 360 to 420 nm, the primary radiation emitted being exposed to at least three phosphors with an emission maximum in the blue (430 to 470 nm), green (495 to 540 nm) and red (in particular 540 to 620 nm) for conversion.

10. The illumination unit as claimed in claim 6, wherein, to generate white light, the primary radiation emitted is in the wavelength region from 420 to 480 nm, the primary radiation emitted being exposed to at least two phosphors with an emission maximum in the green (495 to 540 nm) and red (in particular 540 to 620 nm) for conversion.

11. The illumination unit as claimed in claim 1, wherein, to generate colored light, the primary radiation emitted lies in the UV wavelength region from 300 to 570 nm, the primary radiation emitted being exposed to a single phosphor as described in claim 1.

12. The illumination unit as claimed in claim 1, wherein the nitride-containing phosphor is $M'M''Si_4N_7$:D, where M'=Sr or Ba, in each case alone or in combination, (in particular M' is replaced by up to 20 mol % of Ca); M''=Lu alone or in combination with Gd and/or La.

13. The illumination unit as claimed in claim 1, wherein the nitride-containing phosphor is $M'M''Si_6N_{11}$:D, where $M'=Ba_xSr_{3-x}$, with $1.3 \leq x \leq 1.7$; in particular with a small amount of added Ca;

M''=Lu alone or in combination with Gd and/or La and/or Y.

14. The illumination unit as claimed in claim 1, wherein the nitride-containing phosphor is $M'_2M''_7Si_{11}N_{23}$:D, where M'=Ba alone or in combination with Sr (up to 50 mol %) and M''=La alone or in combination with Gd and/or Lu.

15. The illumination unit as claimed in claim 1, wherein the nitride-containing phosphor is $M''Si_3N_5$:D, where M''=La alone or in combination with Gd and/or Lu, and where D=Ce.

16. The illumination unit as claimed in claim 1, wherein the nitride-containing phosphor is $M''_{16}Si_{15}O_6N_{32}$:Ce, where M''=La alone or in combination with Gd and/or Lu.

17. The illumination unit as claimed in claim 1, wherein the nitride-containing phosphor is $M'SiAl_2O_3N_2$:D, where M'=Sr alone or in combination with Ba and/or Ca; in particular, the proportion of Ba may be up to 50 mol %, and the proportion of Ca may be up to 20 mol %.

18. The illumination unit as claimed in claim 1, wherein the nitride-containing phosphor is $M'_3M''_{10}Si_{18}Al_{12}O_{18}N_{36}$:D, where M'=Sr alone or in combination with Ba and/or Ca; in particular, the proportion of Ba may be up to 50 mol %, and the proportion of Ca may be up to 20 mol %; where M''=La alone or in combination with Gd and/or Lu.

19. The illumination unit as claimed in claim 1, wherein the nitride-containing phosphor is $M''Si_5Al_2ON_9$:$Ce^{3+}$, where M''=La alone or in combination with Gd and/or Lu.

20. The illumination unit as claimed in claim 1, wherein the nitride-containing phosphor is $M''_3Si_5AlON_{10}$:$Ce^{3+}$, where M''=La alone or in combination with Gd and/or Lu.

21. The illumination unit as claimed in claim 1, wherein the illumination unit is a luminescence conversion LED, in which the phosphors are in direct or indirect contact with the chip.

22. The illumination unit as claimed in claim 1, wherein the illumination unit is an array of LEDs.

23. The illumination unit as claimed in claim 12, wherein at least one of the phosphors is applied to an optical device arranged in front of the LED array.

24. A pigment with daylight fluorescence, in particular a phosphor, the structure of which is based on nitrides or derivatives thereof, wherein the composition is derived from a cation M and a silicon nitride or a derivative of a nitride, the cation being partially replaced by a dopant D, namely $Eu^{2+}$ or $Ce^{3+}$, the cation M used being at least one of the divalent metals Ba, Ca, Sr and/or at least one of the trivalent metals Lu, La, Gd, Y, the phosphor originating from one of the following classes:

nitrides of the structure $MSi_3N_5$, $M_2Si_4N_7$, $M_4Si_6N_{11}$ and $M_9Si_{11}N_{23}$, oxynitrides of the structure $M_{16}Si_{15}O_6N_{32}$ sialons of the structure $MSiAl_2O_3N_2$, $M_{13}Si_{18}Al_{12}O_{18}N_{36}$, $MSi_5Al_2ON_9$ and $M_3Si_5AlON_{10}$.

25. The pigment as claimed in claim 24, wherein the proportion of the dopant is 0.5 to 15 mol % of the cation.

26. The pigment as claimed in claim 24, wherein, in the case of doping with $Ce^{3+}$, an additional dopant, namely $Pr^{3+}$ and/or $Tb^{3+}$, is used, the content of which forms at most 30 mol % of the $Ce^{3+}$ content.

27. The pigment as claimed in claim 24, wherein, in the case of doping with $Eu^{2+}$, an additional dopant, namely $Mn^{2+}$, is used, the proportion of which additional dopant amounts to at most four times the proportion of $EU^{2+}$.

28. The pigment as claimed in claim 24, wherein each $Eu^{2+}$ ion in the phosphor is coordinated by at least two or more nitride ligands.

29. The pigment as claimed in claim 24, wherein the nitride-containing phosphor is $M'M''Si_4N_7$:D, where M'=Sr or Ba, in each case alone or in combination, (in particular M' is replaced by up to 20 mol % of Ca); M''=Lu alone or in combination with Gd and/or La.

30. The pigment as claimed in claim 24, wherein the nitride-containing phosphor is $M'M''Si_6N_{11}$:D, where $M'=Ba_xSr_{3-x}$, with $1.3 \leq x \leq 1.7$; in particular with a small amount of added Ca;

M''=Lu alone or in combination with Gd and/or La and/or Y.

31. The pigment as claimed in claim 24, wherein the nitride-containing phosphor is $M'_2M''_7Si_{11}N_{23}$:D, where M'=Ba alone or in combination with Sr (up to 50 mol %) and M''=La alone or in combination with Gd and/or Lu.

32. The pigment as claimed in claim 24, wherein the nitride-containing phosphor is $M''Si_3N_5$:D, where M''=La alone or in combination with Gd and/or Lu, and where D=Ce.

33. The pigment as claimed in claim 24, wherein the nitride-containing phosphor is $M''_{16}Si_{15}O_6N_{32}$:Ce, where M''=La alone or in combination with Gd and/or Lu.

34. The pigment as claimed in claim 24, wherein the nitride-containing phosphor is $M'SiAl_2O_3N_2$:D, where M'=Sr alone or in combination with Ba and/or Ca; in particular, the proportion of Ba may be up to 50 mol %, and the proportion of Ca may be up to 20 mol %.

35. The pigment as claimed in claim 24, wherein the nitride-containing phosphor is $M'_3M''_{10}Si_{18}Al_{12}O_{18}N_{36}$:D, where M'=Sr alone or in combination with Ba and/or Ca; in particular, the proportion of Ba may be up to 50 mol %, and the proportion of Ca may be up to 20 mol %; where M''=La alone or in combination with Gd and/or Lu.

36. The pigment as claimed in claim 24, wherein the nitride-containing phosphor is $M''Si_5Al_2ON_9$:$Ce^{3+}$, where M''=La alone or in combination with Gd and/or Lu.

37. The pigment as claimed in claim 24, wherein the nitride-containing phosphor is $M''_3Si_5AlON_{10}$:$Ce^{3+}$, where M''=La alone or in combination with Gd and/or Lu.

* * * * *